US007955520B2

(12) United States Patent
White et al.

(10) Patent No.: US 7,955,520 B2
(45) Date of Patent: Jun. 7, 2011

(54) COPPER-PASSIVATING CMP COMPOSITIONS AND METHODS

(75) Inventors: Daniela White, Oswego, IL (US); Jason Keleher, Joliet, IL (US); John Parker, Naperville, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 824 days.

(21) Appl. No.: 11/986,921

(22) Filed: Nov. 27, 2007

(65) Prior Publication Data

US 2009/0134122 A1    May 28, 2009

(51) Int. Cl.
*C09K 13/00* (2006.01)
(52) U.S. Cl. ...................................................... 252/79.1
(58) Field of Classification Search ................... 252/79.1
See application file for complete search history.

(56) References Cited

U.S. PATENT DOCUMENTS

| 6,409,781 | B1* | 6/2002 | Wojtczak et al. ............... 51/308 |
| 6,783,432 | B2 | 8/2004 | Li et al. |
| 7,071,105 | B2 | 7/2006 | Carter et al. |
| 2004/0148867 | A1 | 8/2004 | Matsumi et al. |
| 2004/0152309 | A1 | 8/2004 | Carter et al. |
| 2009/0090888 | A1* | 4/2009 | Chang ........................ 252/79.1 |

* cited by examiner

*Primary Examiner* — Roberts Culbert
(74) *Attorney, Agent, or Firm* — Thomas E. Omholt; Robert J. Ross; Steven D. Weseman

(57) ABSTRACT

The present invention provides chemical-mechanical polishing (CMP) methods and compositions for polishing copper-containing substrates. The methods of the present invention entail abrading a surface of a copper-containing substrate with a CMP composition of the invention, preferably in the presence of an oxidizing agent (e.g., hydrogen peroxide). The CMP compositions of the invention comprise a particulate abrasive, a copper-complexing agent, a copper-passivating agent bearing an acidic OH group and an additional oxygen substituent in a 1,6 relationship to the acidic OH group, and an aqueous carrier. A preferred composition of the invention comprises about 0.01 to about 1 percent by weight of the particulate abrasive, about 0.1 to about 1 percent by weight of the copper-complexing agent, about 10 to about 1000 ppm of the copper-passivating agent.

9 Claims, 2 Drawing Sheets

US 7,955,520 B2

COPPER-PASSIVATING CMP COMPOSITIONS AND METHODS

FIELD OF THE INVENTION

This invention relates to polishing compositions and methods for polishing a copper-containing substrate. More particularly, this invention relates to chemical-mechanical polishing compositions and methods for polishing copper-containing substrates utilizing a copper-complexing agent and a copper-passivating agent.

BACKGROUND OF THE INVENTION

Many compositions and methods for chemical-mechanical polishing (CMP) the surface of a substrate are known in the art. Polishing compositions (also known as polishing slurries, CMP slurries, and CMP compositions) for polishing metal-containing surfaces of semiconductor substrates (e.g., integrated circuits) typically contain abrasives, various additive compounds, and the like, and frequently are used in combination with an oxidizing agent. Such CMP compositions are often designed for removal of specific substrate materials such as metals (e.g., tungsten or copper), insulators (e.g., silicon dioxide, such as plasma-enhanced tetraethylorthosilicate (PETEOS)-derived silica), and semiconductive materials (e.g., silicon or gallium arsenide).

In conventional CMP techniques, a substrate carrier (polishing head) is mounted on a carrier assembly and positioned in contact with a polishing pad in a CMP apparatus. The carrier assembly provides a controllable pressure (down force) to urge the substrate against the polishing pad. The pad and carrier, with its attached substrate, are moved relative to one another. The relative movement of the pad and substrate serves to abrade the surface of the substrate to remove a portion of the material from the substrate surface, thereby polishing the substrate. The polishing of the substrate surface typically is further aided by the chemical activity of the polishing composition (e.g., by oxidizing agents present in the CMP composition) and/or the mechanical activity of an abrasive suspended in the polishing composition. Typical abrasive materials include, for example, silicon dioxide (silica), cerium oxide (ceria), aluminum oxide (alumina), zirconium oxide (zirconia), titanium dioxide (titania), and tin oxide.

The abrasive desirably is suspended in the CMP composition as a colloidal dispersion, which preferably is colloidally stable. The term "colloid" refers to the suspension of abrasive particles in the liquid carrier. "Colloidal stability" refers to the maintenance of that suspension during a selected period of time with minimal settling. In the context of this invention, an abrasive suspension is considered colloidally stable if, when the suspension is placed into a 100 mL graduated cylinder and allowed to stand without agitation for a period of time of about 2 hours, the difference between the concentration of particles in the bottom 50 mL of the graduated cylinder ([B] in terms of g/mL) and the concentration of particles suspended in the top 50 mL of the graduated cylinder ([T] in terms of g/mL) divided by the initial concentration of particles suspended in the abrasive composition ([C] in terms of g/mL) is less than or equal to about 0.5 (i.e., ([B]−[T])/[C] ≦0.5). The value of ([B]−[T])/[C] desirably is less than or equal to about 0.3, and preferably is less than or equal to about 0.1.

U.S. Pat. No. 5,527,423 to Neville et al., for example, describes a method for chemically-mechanically polishing a metal layer by contacting the surface of the metal layer with a polishing slurry comprising high purity fine metal oxide particles suspended in an aqueous medium. Alternatively, the abrasive material may be incorporated into the polishing pad. U.S. Pat. No. 5,489,233 to Cook et al. discloses the use of polishing pads having a surface texture or pattern, and U.S. Pat. No. 5,958,794 to Bruxvoort et al. discloses a fixed abrasive polishing pad.

For copper CMP applications it often is desirable to use a relatively low-solids dispersion (i.e., having an abrasive concentration at a total suspended solids (TSS) level of about 1 percent by weight or less), which is chemically reactive toward copper. Chemical reactivity can be modulated through the use of oxidizing agents, chelating agents, corrosion inhibitors, pH, ionic strength, and the like. Balancing the chemical reactivity and mechanical abrasive properties of the CMP slurry can be complicated. Many commercial copper CMP slurries are highly chemically reactive, and exhibit high a copper static etch rates (SER) of well over 100 Angstroms-per-minute (Å/min), which can be controlled, at least in part, by organic corrosion inhibitors, such as benzotriazole (BTA), triazoles, and imidazoles. Such compositions often do not have good corrosion control after polishing, however. Common commercial copper CMP slurries also frequently suffer from dishing-erosion, defectivity, and surface topography problems.

There is an ongoing need to develop new copper CMP compositions and methods utilizing relatively low-solids CMP slurries with a reduced level of dishing-erosion and defectivity, relatively high copper removal rates, as well as superior corrosion protection and surface inhibition compared to conventional CMP slurries. These and other advantages of the invention, as well as additional inventive features, will be apparent from the description of the invention provided herein.

SUMMARY OF THE INVENTION

The present invention provides chemical-mechanical polishing (CMP) compositions and methods for polishing copper-containing substrates. The methods of the present invention entail abrading a surface of a copper-containing substrate with a CMP composition of the invention, preferably in the presence of an oxidizing agent (e.g., hydrogen peroxide). The compositions and methods of the invention can provide relatively high copper removal rates with good copper passivation, compared to conventional copper CMP slurries.

The CMP compositions of the invention comprise a particulate abrasive, a copper-complexing agent, a copper-passivating agent, and an aqueous carrier. The copper-passivating agent includes an acidic OH group and an additional oxygen-bearing substituent having an oxygen atom disposed in a 1,6 relationship to the oxygen atom of the acidic OH group. A preferred composition of the invention comprises about 0.01 to about 1 percent by weight of a particulate abrasive, about 0.1 to about 1 percent by weight of the copper-complexing agent, about 10 to about 1000 parts-per-million (ppm) of the copper-passivating, dissolved and/or suspended in the aqueous carrier.

Preferred copper-passivating agents are compounds having the general formula (I): A-X—Y—OH, as well as salts of formula (I), and partially neutralized forms of formula (I). In formula (I), A is —N($R^1$)—C(=O)—$R^2$ or —C(=O)—NH—OH; and either X is —C($R^3$)($R^4$)— and Y is —C(=O)—, or X and Y together form an aryl moiety in which the A and OH groups of formula (I) are disposed in an ortho relationship to one another. Preferably, the aryl moiety formed by X and Y is a phenyl or naphthyl group, most preferably a phenyl group. $R^1$ is H, substituted $C_1$-$C_4$ alkyl, or unsubstituted $C_1$-$C_4$ alkyl. $R^2$ is substituted $C_8$-$C_{20}$ alkyl or unsubstituted $C_8$-$C_{20}$ alkyl. $R^3$ and $R^4$ are each independently H, substituted $C_1$-$C_4$ alkyl, or unsubstituted $C_1$-$C_4$ alkyl. Non-limiting examples of compounds of formula (I) include N-acyl glycine compounds (e.g., as N-acyl sarcosines, such as N-lauroyl sarcosine), and o-hydroxyaryl hydroxamic acids (e.g., salicylhydroxamic acid, and the like). Preferred salt forms of the copper-passivating agents are alkali metal salts (e.g., sodium and potassium salts).

Non-limiting examples of preferred copper-complexing agents include oxalic acid, amino-substituted carboxylic acids (e.g., α-amino acids such as glycine, or amino polycarboxylic acids, such as iminodiacetic acid, and the like), hydroxyl-substituted carboxylic acids (e.g., citric acid, and the like), as well as salts of the complexing agents (e.g., alkali metal salts).

DETAILED DESCRIPTION OF PREFERRED EMBODIMENTS

Figure 1:
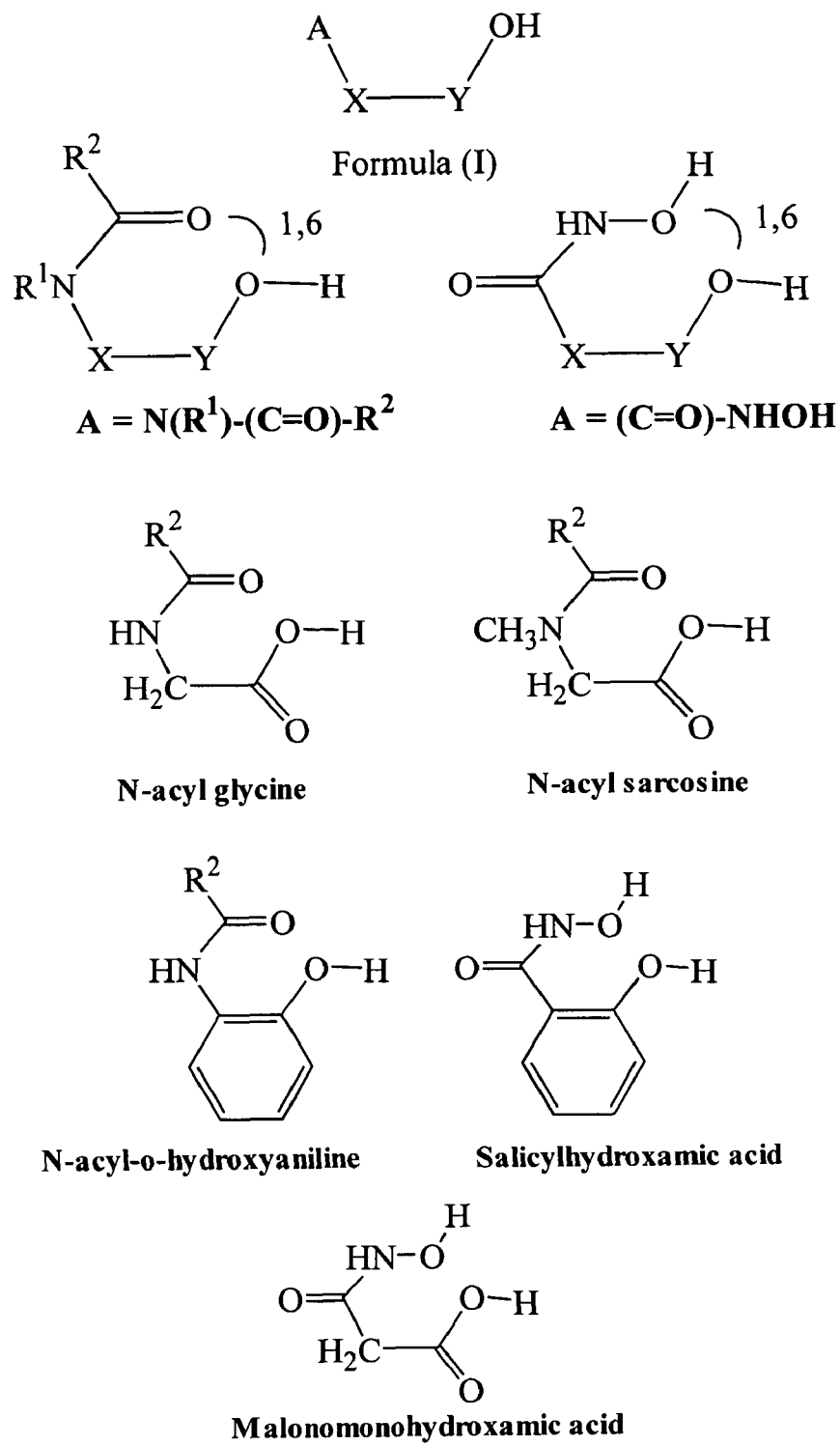
FIG. 1 shows the chemical structures of selected copper-passivating agents useful in the compositions and methods of the invention.

The CMP compositions of the invention comprise a particulate abrasive, a copper-complexing agent, a copper-passivating agent, and an aqueous carrier therefor, and provide for relatively high copper removal rates, relatively low defectivity, and good surface passivation when used to polish a copper-containing substrate.

Particulate abrasives useful in the CMP compositions and methods of the invention include any abrasive material suitable for use in CMP of semiconductor materials. Non-limiting examples of suitable abrasive materials include silica (e.g., fumed silica and/or colloidal silica), alumina, titania, ceria, zirconia, or a combination of two or more of the foregoing abrasives, which are well known in the CMP art. Preferred abrasives include silica, particularly colloidal silica, as well as titania. The abrasive material preferably is present in the CMP slurry at a concentration of not more than about 1 percent by weight (10,000 parts-per-million; ppm). In some preferred embodiments, the abrasive material is present in the CMP composition at a concentration in the range of about 0.1 to about 1 percent by weight, more preferably in the range of about 0.1 to about 0.5 percent by weight. Preferred abrasives have a mean particle size of about 100 nm or less, as determined by laser light scattering techniques, which are well known in the art.

Copper-complexing agents useful in the compositions and methods of the invention preferably are carboxylate materials. As used herein and in the appended claims, the terms "carboxylate", "carboxylic acid" and any similar related terms, encompass the acid form, the salt form, and partially neutralized forms of a compound that bears a carboxylic acid group (i.e., a —C(=O)OH group). Accordingly, all references to copper-complexing agents in the context of the present invention are to be construed as referring to any and all forms of the agents, i.e., the acid form, salt forms, and partially neutralized forms, which are functionally interchangeable with one another.

Non-limiting examples of copper-complexing agents for use in the present invention include oxalic acid, amino-substituted carboxylic acids (e.g., amino polycarboxylates, such as iminodiacetic acid (IDA), ethylenediaminedisuccinic acid (EDDS), iminodisuccinic acid (IDS), ethylenediaminetetraacetic acid (EDTA), nitrilotriacetic acid (NTA), as well as α-amino acids, such as glycine, β-amino acids, and the like); hydroxyl-substituted carboxylic acids (e.g., glycolic acid and lactic acid, as well as hydroxyl polycarboxylic acids, such as malic acid, citric acid, tartaric acid, and the like); phosphonocarboxylic acids; aminophosphonic acids; salts of any of the foregoing; combinations of two or more of the foregoing; and the like. Preferred salts of copper-complexing agents include water soluble salts such as alkali metal salts (e.g., lithium, sodium, and potassium salts).

Preferably, the copper-complexing agent is selected from the group consisting of oxalic acid, an amino-substituted carboxylic acid, a hydroxyl-substituted carboxylic acid, a salt thereof, and a combination of two or more of the foregoing, all of which share the common characteristic of at least one carboxylic acid group and a second polar functional group (e.g., a hydroxyl group, an amino group, or an additional carboxylic acid group), which together can cooperatively interact with, and bind to copper ions. The copper-complexing agent preferably is present in the composition at a concentration in the range of about 0.1 to about 1.5 percent by weight.

Copper-passivating agents useful in the compositions and methods of the present invention are compounds that include at least one acidic OH group (e.g., an OH substituent on an aromatic ring, a hydroxamic acid substituent, or a carboxylic acid substituent) and at least one other oxygen-bearing substituent having an oxygen atom disposed in a 1,6 relationship to the oxygen of the acidic OH group. All references to copper-passivating agents in the context of the present invention are to be construed as referring to any and all forms of the agent, i.e., the acid form, the salt form, and partially neutralized forms, which are functionally interchangeable with one another.

Preferred copper-passivating agents are compounds having the general formula (I): A-X—Y—OH, as well as salts of formula (I), and combinations of the acid form and a salt form of formula (I), in which A is —N($R^1$)—C(=O)—$R^2$ or —C(=O)—NH—OH; and either X is —C($R^3$)($R^4$)— and Y is —C(=O)—, or X and Y together form an aryl group in which the A and OH groups in formula (I) are positioned in a 1,2 or "ortho" relationship to one another. In formula (I), $R^1$ is H, substituted $C_1$-$C_4$ alkyl, or unsubstituted $C_1$-$C_4$ alkyl; $R^2$ is substituted $C_8$-$C_{20}$ alkyl or unsubstituted $C_8$-$C_{20}$ alkyl; and $R^3$ and $R^4$ are each independently H, substituted $C_1$-$C_4$ alkyl, or unsubstituted $C_1$-$C_4$ alkyl. Compounds of formula (I) include N-acyl glycine compounds (e.g., N lauroyl glycine and N-lauroyl sarcosine), o-hydroxyaryl hydroxamic acid compounds (e.g., salicylhydroxamic acid), o-hydroxy-N-acyl aniline compounds, and malonomonohydroxamic acid. Preferred compounds of formula (I) are o-hydroxyaryl hydroxamic acids, such as salicylhydroxamic acid, and N-acyl sarcosine compounds, such as N-lauroyl sarcosine, as well as the salts and partially neutralized forms thereof. Preferred salt forms of the copper-passivating agents are alkali metal salts (e.g., lithium, sodium, and potassium salts). Preferably, the copper-passivating agent is present in the composition at a concentration in the range of about 10 to about 1,000 ppm, more preferably about 50 to about 500 ppm.

The alternative "A" moieties in formula (I) are N-acylamino and hydroxamic acid groups, which share the common characteristic of being polar substituents that include both a nitrogen atom and at least one oxygen atom in close proximity to the nitrogen (i.e., the oxygen and nitrogen of the N-acyl group are separated by a single carbon atom, whereas in the hydroxamic acid there are two oxygen atoms—one that is adjacent to the nitrogen and one that is separated by one carbon atom from the nitrogen). Similarly, the "X" and "Y" moieties of formula (I) share the following common characteristics: (1) they each impart acidic character to the OH group (e.g., by virtue of the unsaturated carbon atom to which the OH is bonded), and (2) they collectively provide a 1,6 spacing between the oxygen of the OH group and an oxygen atom of the "A" group. Together, the A, X, Y and OH functional groups in the compounds of formula (I) are arranged in a manner that facilitates binding to copper. During use, the compounds adsorb onto the surface of the substrate and provide a passivating layer on the copper surface.

FIG. 1 provides structural formulas for selected copper-passivating agents that are useful in the compositions and methods of the present invention, e.g., formula (I) including N-acyl glycine and sarcosine compounds, salicylhydroxamic acid, malonomonohydroxamic acid, N-acyl-o-hydroxy aniline compounds, and the like. FIG. 1 also illustrates the 1,6 relationship between the acidic OH and the additional oxygen-bearing substituent in the passivating agents.

The CMP compositions of the invention preferably have a pH in the range of about 5 to about 10. The CMP compositions can optionally comprise one or more pH buffering materials, for example, ammonium acetate, disodium citrate, and the like. Many such pH buffering materials are well known in the art.

The aqueous carrier for the compositions of the present invention preferably is water (e.g., deionized water), and optionally can contain one or more water-miscible organic solvent, such as an alcohol.

The CMP compositions of the invention also optionally can comprise one or more additives, such as a surfactant, a rheological control agent (e.g., a viscosity enhancing agent or coagulant), a biocide, a corrosion inhibitor, an oxidizing agent, and the like, many of which are well known in the CMP art.

The CMP compositions of the invention can be prepared by any suitable technique, many of which are known to those skilled in the art. The CMP composition can be prepared in a batch or continuous process. Generally, the CMP composition can be prepared by combining the components thereof in any order. The term "component" as used herein includes individual ingredients (e.g., abrasives, complexing agents, passivating agents, acids, bases, aqueous carriers, and the like) as well as any combination of ingredients. For example, an abrasive can be dispersed in water, and the copper-passivating agent and copper-complexing agent can be added, and mixed by any method that is capable of incorporating the components into the CMP composition. Typically, an oxidizing agent can be added just prior to initiation of polishing. The pH can be adjusted at any suitable time.

The CMP compositions of the present invention also can be provided as a concentrate, which is intended to be diluted with an appropriate amount of water or other aqueous carrier prior to use. In such an embodiment, the CMP composition concentrate can include the various components dispersed or dissolved in the aqueous carrier in amounts such that, upon dilution of the concentrate with an appropriate amount of aqueous carrier, each component of the polishing composition will be present in the CMP composition in an amount within the appropriate range for use.

The CMP compositions of the present invention can be used to polish any suitable substrate, and are especially useful for polishing substrates comprising copper.

In another aspect, the present invention provides a method of polishing a copper-containing substrate by abrading a surface of the substrate with a CMP composition of the invention. Preferably, the CMP composition is utilized to polish the substrate in the presence of an oxidizing agent, e.g., about 0.1 to about 5 percent by weight of an oxidizing agent. Non-limiting examples of useful oxidizing agents include, hydrogen peroxide, inorganic and organic peroxo-compounds, bromates, nitrates, chlorates, chromates, iodates, potassium ferricyanide, potassium dichromate, iodic acid and the like. Non-limiting examples of compounds containing at least one peroxy group include hydrogen peroxide, urea hydrogen peroxide, percarbonates, benzoyl peroxide, peracetic acid, di-t-butyl peroxide, monopersulfates ($SO_5^{2-}$), and dipersulfates ($S_2O_8^{2-}$). Non-limiting examples of other oxidizing agents, which contain an element in its highest oxidation state include periodic acid, periodate salts, perbromic acid, perbromate salts, perchloric acid, perchlorate salts, perboric acid, perborate salts, and permanganates.

The CMP methods of the present invention are particularly suited for use in conjunction with a chemical-mechanical polishing apparatus. Typically, the CMP apparatus comprises a platen, which, when in use, is in motion and has a velocity that results from orbital, linear, and/or circular motion. A polishing pad is mounted on the platen and moves with the platen. A polishing head holds a substrate to be polished in contact with the pad and moves relative to the surface of the polishing pad, while urging the substrate against the pad at a selected pressure (down force) to aid in abrading the surface of the substrate. A CMP slurry is pumped onto the polishing pad to aid in the polishing process. The polishing of the substrate is accomplished by the combined abrasive action of the moving polishing pad and the CMP composition of the invention present on the polishing pad, which abrade at least a portion of the surface of the substrate. The polishing is also aided by the chemical activity of the CMP composition (i.e., oxidation, complexation, passivation, and the like).

The methods of the present invention can utilize any suitable polishing pad (e.g., polishing surface). Non-limiting examples of suitable polishing pads include woven and non-woven polishing pads, which can include fixed abrasives, if desired. Moreover, polishing pads can comprise any polymer that has a suitable density, hardness, thickness, compressibility, ability to rebound upon compression, compression modulus, chemical compatibility, and the like. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. No. 5,196,353 to Sandhu et al., U.S. Pat. No. 5,433,651 to Lustig et al., U.S. Pat. No. 5,949,927 to Tang, and U.S. Pat. No. 5,964,643 to Birang et al. Desirably, the inspection or monitoring of the progress of the polishing process with respect to a workpiece being polished enables the determination of the polishing end-point, i.e., the determination of when to terminate the polishing process with respect to a particular workpiece.

The following non-limiting examples further illustrate various aspects of the present invention.

EXAMPLE 1

Evaluation of CMP Compositions Comprising Salicylhydroxamic Acid (SHA) and a Complexing Agent CMP compositions of the invention having a pH in the range of about 5 to 7, containing about 50 to about 500 ppm of salicylhydroxamic acid (SHA; a copper-passivating agent), about 1 percent by weight iminodiacetic acid (IDA; a copper-complexing agent), and about 0.1 to about 1 percent by weight colloidal silica (mean particle size of about 80 nm), were utilized to polish 4-inch diameter copper blanket wafers in the presence of about 0.8% by weight hydrogen peroxide. The amounts of SHA, abrasive, and pH of each composition is provided in Table 1. The wafers were polished on a Logitech Model II CDP polisher (Logitech Ltd., Glasgow, UK) under the following operating conditions: a D100 polishing pad, platen speed of about 85 revolutions-per-minute (rpm), carrier speed of about 93 rpm, down force of either 1 pound-per-square inch (psi) or 3 psi, and a slurry flow rate of 120 milliliters-per-minute (mL/min).

The observed copper removal rates (Cu RR in Å/min) obtained with each composition at 1 and 3 psi down force are also presented in Table 1. The data in Table 1 indicate that at relatively high levels of SHA and neutral pH (i.e., 500 ppm, pH 7) passivation greatly reduces the observed copper removal rate compared to removal rates obtained at lower levels of SHA, regardless of the abrasive level or down force. In contrast, at pH 5, the 500 ppm level of SHA still provided copper removal rates in the range of 1000 to 4000 Å/min. surprisingly, 0.1% by weight of abrasive afforded higher removal rates (i.e., 2825 at 1 psi, and 3974 at 3 psi) compared to the composition comprising 1% by weight abrasive (1082 at 1 psi, 1847 at 3 psi). The copper removal rates obtained compositions comprising 1% by weight silica and 50 ppm SHA afforded somewhat higher removal rates than the compositions that included 0.1% by weight silica and 50 ppm SHA regardless of pH (i.e., compare Ex. 1C to 1E and compare Ex. 1D with 1H). Surprisingly, the compositions including 50 ppm SHA exhibited slightly higher copper removal rates at pH 7 compared to pH 5, regardless of the abrasive level (compare Ex. 1D with 1E, and compare Ex. 1H with 1C). This is in contrast to the compositions having higher levels of SHA (500 ppm), which exhibited higher removal rates at pH 5 rather than pH 7, as noted above. In each example, the removal rate increased with increasing down force. Passivation by SHA was also confirmed electrochemically (i.e., by a Tafel plot).

TABLE 1

| Example # | SHA, ppm | pH | % Abrasive | Cu RR, 1 psi | Cu RR, 3 psi |
|---|---|---|---|---|---|
| 1A | 500 | 5 | 1 | 1082 | 1847 |
| 1B | 275 | 6 | 0.55 | 2636 | 4303 |
| 1C | 50 | 5 | 0.1 | 2832 | 4004 |
| 1D | 50 | 7 | 1 | 3376 | 5273 |
| 1E | 50 | 5 | 1 | 3074 | 4863 |
| 1F | 500 | 7 | 1 | 258 | 443 |
| 1G | 500 | 7 | 0.1 | 184 | 246 |
| 1H | 50 | 7 | 0.1 | 2964 | 4162 |
| 1I | 500 | 5 | 0.1 | 2825 | 3974 |

In a separate experiment, the copper static etch rate (SER) was determined for a composition comprising about 0.5% by weight of the colloidal silica, about 1% by weight glycine, and about 250 ppm (0.025%) SHA in water at pH 6 containing about 0.8% by weight hydrogen peroxide. The SER was measured by immersing a 1-inch square copper wafer in about 200 grams of the CMP composition for about 10 to 30 minutes. The thickness of the copper layer was measured before and after immersion. The SER (in Å/min) was calculated by the following formula: SER=(change in copper thickness in Å)/(the duration of the test in minutes). The observed SER was about 17 Å/min, indicating good passivation. A control composition having no SHA had a SER of about 1342 Å/min.

EXAMPLE 2

Evaluation of CMP Compositions Comprising N-Lauroyl Sarcosine (NLS) and Iminodiacetic Acid (IDA)

CMP compositions of the invention were utilized to polish 4-inch diameter copper blanket wafers. The compositions included about 0.1 percent by weight of colloidal silica abrasive (mean particle size of about 80 nm), about 100 ppm or 1000 ppm of N-lauroyl sarcosine (NLS), in combination with about 1 percent by weight of IDA. The wafers were polished on a Logitech Model II CDP polisher (Logitech Ltd., Glasgow, UK) in the presence of about 0.8 percent by weight hydrogen peroxide at a pH of about 7, under the following operating conditions: a D100 polishing pad, platen speed of about 85 rpm, carrier speed of about 93 rpm, down force of about 1 or about 3 psi, and a slurry flow rate of 120 mL/min. The SER for each composition was also determined.

The composition containing about 100 ppm of the NLS exhibited a static etch rate (SER) for copper of about 34 Å/min, while the composition containing about 1000 ppm of NLS had a SER of about 5 Å/min. The composition containing about 100 ppm of NLS also exhibited relatively high copper removal rates (about 3220 and 4400 Å/min at 1 psi and 3 psi down force, respectively), compared to the composition containing 1000 ppm of NLS, which provided very low copper removal rates at both levels of down force (<50 Å/min). These results indicate that NLS provides a relatively high level of passivation at the higher level of NLS (1000 ppm).

EXAMPLE 3

Effect of Down Force on Removal Rate

Figure 2:
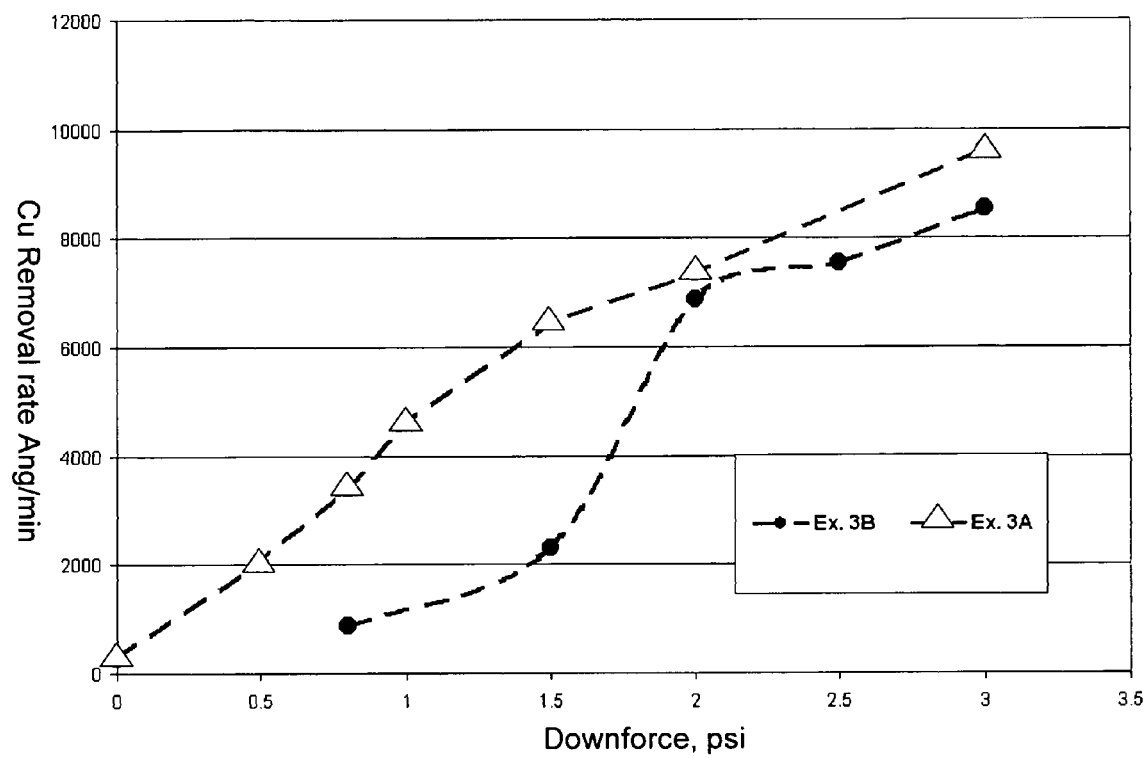
FIG. 2 shows plots of copper removal rate (Cu RR) versus down force (DF) obtained by polishing copper wafers utilizing a composition of the invention, compared to results obtained with a control composition.

A composition of the invention (Ex. 3A) comprising about 0.5% by weight of the colloidal silica, about 1% by weight glycine, and about 250 ppm (0.025%) SHA in water at pH 6 was utilized to polish 4-inch diameter copper blanket wafers on a Logitech polisher in the presence of about 0.8% by weight hydrogen peroxide under the following conditions: a D100 polishing pad, platen speed of about 85 rpm, carrier speed of about 93 rpm, down force of about 0 or about 3 psi, and a slurry flow rate of 120 mL/min. For comparison, wafers were also polished utilizing a model CMP slurry (Ex. 3B) comprising about 0.5% by weight of the colloidal silica, and about 1% by weight glycine, in water at pH 6 in the presence of about 0.8% by weight hydrogen peroxide under the same polishing conditions. A plot of Cu Removal Rate versus down force for each composition is provided in FIG. 2. As is readily apparent in FIG. 2, the composition of the present invention (Ex. 3A) provided a surprisingly more linear (Prestonian) response to variation in down force compared to the model composition (Ex. 3B), which did not include SHA. A nonlinear response to down force variation can lead to product variability during the polishing process, which is undesirable. The compositions of the present invention advantageously provide a desirable linear relationship between removal rate and down force during copper CMP.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A chemical-mechanical polishing (CMP) composition for polishing a copper-containing substrate, the composition comprising:
    (a) about 0.01 to about 1 percent by weight of a particulate abrasive;
    (b) about 0.1 to about 1 percent by weight of copper-complexing agent;
    (c) about 10 to about 1000 parts-per-million (ppm) a copper-passivating agent that comprises an o-hydroxyaryl hydroxamic acid compound, a salt thereof, or a partially neutralized form thereof; and
    (d) an aqueous carrier therefor.

2. The composition of claim 1 wherein the o-hydroxyaryl hydroxamic acid compound is salicylhydroxamic acid, a salt thereof, or a partially neutralized form thereof.

3. The composition of claim 1 wherein the copper-complexing agent is selected from the group consisting of oxalic acid, an amino-substituted carboxylic acid, a hydroxyl-substituted carboxylic acid, a salt thereof, a partially neutralized form thereof and a combination of two or more of the foregoing.

4. The composition of claim 1 wherein the copper-complexing agent comprises an amino-substituted carboxylic acid, a salt thereof, or a partially neutralized form thereof.

5. The composition of claim 1 wherein the copper-complexing agent comprises a hydroxyl-substituted carboxylic acid, a salt thereof, or a partially neutralized form thereof.

6. The composition of claim 1 wherein the particulate abrasive comprises silica.

7. The composition of claim 1 wherein the particulate abrasive as a mean particle size of not more than about 100 nm.

8. The composition of claim 1 further comprising about 0.1 to about 5 percent by weight of an oxidizing agent.

9. The composition of claim 8 wherein the oxidizing agent is hydrogen peroxide.

* * * * *